United States Patent [19]
Cray et al.

[11] Patent Number: 5,045,975
[45] Date of Patent: Sep. 3, 1991

[54] THREE DIMENSIONALLY INTERCONNECTED MODULE ASSEMBLY

[75] Inventors: Seymour R. Cray, Chippewa Falls; Nicholas J. Krajewski, Elk Mound, both of Wis.

[73] Assignee: Cray Computer Corporation, Colorado Springs, Colo.

[21] Appl. No.: 386,290

[22] Filed: Jul. 27, 1989

Related U.S. Application Data

[63] Continuation of Ser. No. 53,142, Mar. 21, 1987.

[51] Int. Cl.$^5$ ............................................... H05K 1/10
[52] U.S. Cl. ..................................... 361/412; 29/830; 29/838; 174/68.1; 428/901
[58] Field of Search .................... 439/55; 29/838, 830; 428/901; 174/68.5; 361/412, 413, 414

[56] References Cited

U.S. PATENT DOCUMENTS

| | | |
|---|---|---|
| 1,946,889 | 5/1931 | Wessel . |
| 2,694,799 | 11/1954 | Del Camp . |
| 2,969,521 | 1/1961 | Scoville . |
| 3,022,480 | 2/1962 | Tiffany . |
| 3,097,032 | 7/1963 | Hochheiser . |
| 3,212,049 | 10/1965 | Mittler et al. . |
| 3,217,283 | 11/1965 | Shlesinger . |
| 3,255,430 | 6/1966 | Phillips . |
| 3,258,736 | 6/1966 | Crawford . |
| 3,319,217 | 5/1966 | Phillips . |
| 3,333,225 | 7/1967 | McNutt . |
| 3,371,249 | 2/1968 | Prohofsky . |
| 3,373,481 | 3/1968 | Lins et al. . |
| 3,400,358 | 9/1968 | Byrnes et al. . |
| 3,403,438 | 10/1968 | Best et al. . |
| 3,459,998 | 8/1969 | Focarile . |
| 3,568,001 | 3/1971 | Strauss . |
| 3,623,649 | 11/1971 | Keisling . |
| 3,670,409 | 6/1972 | Reimer . |
| 3,672,047 | 6/1972 | Sakamoto et al. . |
| 3,813,773 | 6/1974 | Parks ................................. 29/830 |
| 3,832,603 | 8/1974 | Cray . |
| 3,867,759 | 2/1975 | Seifker . |
| 3,904,934 | 9/1975 | Martin . |
| 4,110,904 | 9/1978 | Johnson . |
| 4,142,228 | 3/1979 | Flammer et al. . |
| 4,208,080 | 6/1980 | Teagno ........................... 29/830 X |
| 4,216,576 | 8/1980 | Ammon et al. . |
| 4,285,002 | 8/1981 | Campbell . |
| 4,295,184 | 10/1981 | Roberts . |
| 4,326,663 | 4/1982 | Oettel . |
| 4,352,533 | 10/1982 | Murase et al. . |
| 4,374,457 | 2/1983 | Wiech, Jr. . |
| 4,417,392 | 11/1983 | Ibrahim et al. . |
| 4,514,784 | 4/1985 | Williams et al. . |
| 4,542,438 | 9/1985 | Yamamoto . |
| 4,550,493 | 11/1985 | Darrow . |
| 4,653,186 | 3/1987 | Kamijo . |
| 4,700,996 | 10/1987 | August et al. . |
| 4,720,770 | 1/1988 | Jameson . |
| 4,734,058 | 3/1988 | Pavlacka . |
| 4,797,113 | 1/1989 | Lambert . |
| 4,813,128 | 3/1989 | Massopust . |
| 4,873,764 | 10/1989 | Grimm ................................. 29/830 |

OTHER PUBLICATIONS

Martyak, Natoli & Ricci, "Connector Interposer for Module to Board Connection," *IBM Technical Disclosure Bulletin*, vol. 14, No. 8 (Jan. 1972).

Primary Examiner—Timothy V. Eley
Attorney, Agent, or Firm—John R. Ley

[57] ABSTRACT

A method and apparatus for interconnecting electronic circuits using nearly pure soft annealed gold mechanically compressed within through-plated holes. The invention has its application in attaching integrated circuit dice directly to circuit boards by ball bonding gold wires to the bonding pads of the integrated circuit dice in a substantially perpendicular relationship to the surfaces of the disc and inserting the gold leads into through-plated holes of circuit boards which provide an electrical and a mechanical connection once the leads are compressed within the through-plated holes. The present invention also finds its application in the interconnection of sandwiched circuit board assemblies where soft gold lead wires are inserted into axially aligned through-plated holes of the circuit boards and compressed so that the gold lead wires compress and buckle within the through-plated holes, forming an electrical connection between the circuit boards.

36 Claims, 14 Drawing Sheets

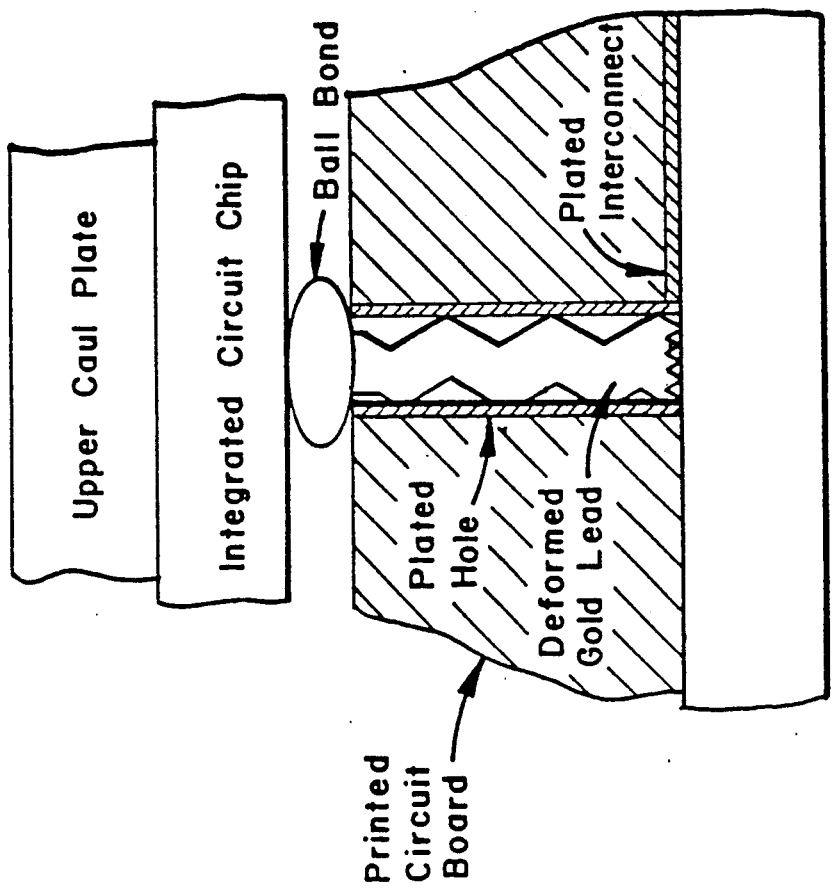
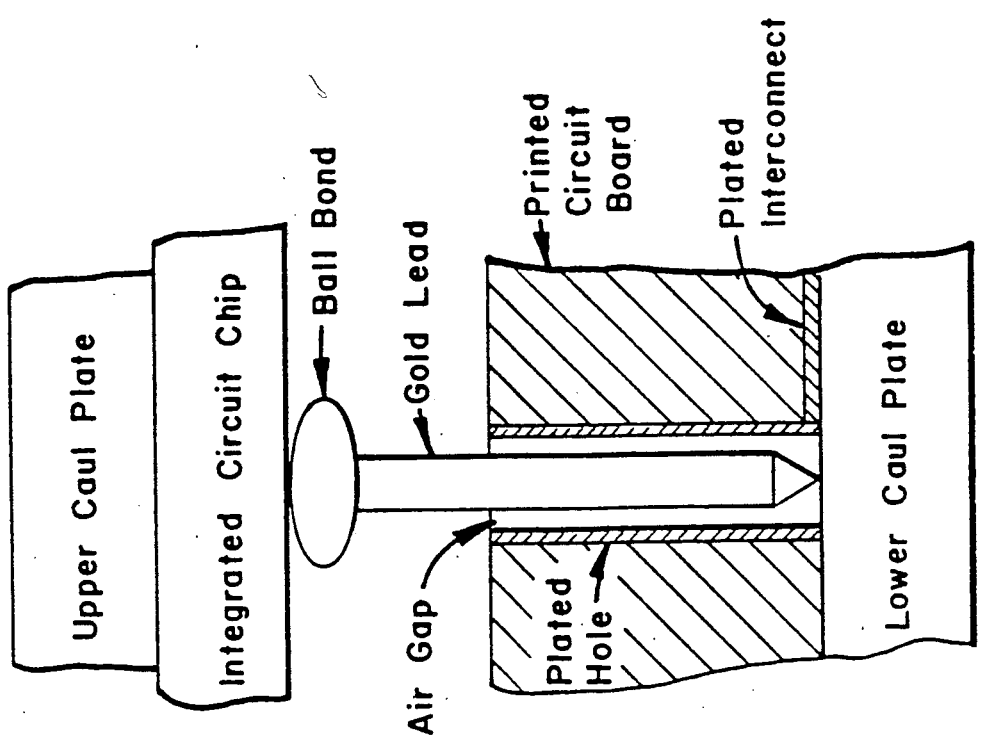

THREE DIMENSIONALLY INTERCONNECTED MODULE ASSEMBLY

This is a continuation of application Ser. No. 07/053,142, filed May 21, 1987.

TECHNICAL FIELD OF THE INVENTION

The present invention relates to the field of electrical circuit interconnect, and more specifically to a new apparatus and method for high-density packing and interconnect of integrated circuits on printed circuit (PC) boards and PC boards on PC boards.

BACKGROUND OF THE INVENTION

Integrated circuits are typically fabricated on wafers which are cut into individual integrated circuits and packaged within hermetically sealed ceramic or plastic packages. The signal and power lines from the integrated circuit are brought out to the pins of the package by means of leads attached to the bonding pads on the integrated circuit chips. The chips are then used to form larger circuits by interconnecting the integrated circuit packages by means of PC boards. The circuit boards contain interconnect lines or foils on the surfaces of the circuit boards or within planar layers. The circuit board is populated with integrated circuit packages which are soldered to plated via holes or on surface mounted pads on the circuit board. The soldering process forms an electrical and mechanical connection between the integrated circuit package and the circuit board.

To form larger circuits, circuit boards populated with integrated circuit packages are interconnected by a variety of connectors, jumper wires, or cables. The physical arrangement of the circuit boards in relation to one another is also accomplished in a wide variety of configurations. One popular high-density interconnect technique is to stack the circuit boards in a sandwiched relationship to one another and electrically interconnect the circuit boards with interboard connectors. This packing technique achieves a fair amount of packing density, limited by the interboard spacing requirements of heat dissipation and connector spacing.

The aforementioned technique of forming larger circuits from individual integrated circuits using integrated circuit packages and circuit boards results in limited packing density of the actual area which is used for electrical circuits. The actual integrated circuit chips themselves are typically smaller than one-tenth of a square inch, and in total would cover only 10-20 percent of the board area. However, due to the inefficiencies of packaging of integrated circuit chips and connecting the integrated circuit chips to the circuit boards, it is difficult or impossible to increase the packing density on circuit boards to improve speed or spacing advantages. In addition, inter-board spacing is limited by the area consumed by the integrated circuit packages and inter-board connects. This limited packing density limits the inter-circuit signal speed due to the long propagation delays along the long interconnect lines.

The present invention provides a new apparatus and method for high-density interconnect of integrated circuit chips on circuit boards and between circuit boards which overcomes the wasted space and speed disadvantages of the prior art.

SUMMARY OF THE INVENTION

The present invention provides for placing unpackaged integrated circuit chips directly on circuit boards by using soft gold lead wires attached to the bonding pads to form the mechanical and electrical connection between the integrated circuit chips and the circuit boards. The present invention also provides for interconnection of sandwiched circuit boards by using soft gold jumper wires connected through the through-plated holes of the circuit boards.

Gold wires comprising nearly pure soft annealed gold are ball-bonded to the bonding pads of integrated circuit chips, and the soft gold wires are stretched to a substantially perpendicular position with respect to the surface of the integrated circuit chip, forming flying leads. The circuit boards to which the integrated circuit chips are to be attached are manufactured with plated holes having hole patterns substantially matching the bonding pad patterns of the integrated circuit chips. The integrated circuit chips with the flying leads are then positioned facing the circuit board and the flying leads are inserted through the plated holes such that the flying leads partially protrude from the circuit board. Caul plates are then positioned on the outer sides of this sandwich and pressed together so that the sticky or soft gold of the flying leads is compressed within the plated holes, causing the soft gold to deform against the surface of the plated holes and thereby forming a strong electrical and mechanical bond. The caul plates are then removed and the integrated circuit package remains firmly attached to the circuit board. This results in improved packing density of integrated circuit chips on circuit boards.

Gold wires comprising nearly pure soft annealed gold are inserted through axially aligned plated holes of two or more circuit boards in a substantially perpendicular direction to the planar surface of the boards. The gold wire is selected to be slightly longer than the distance through the axially aligned holes such that a portion of the wires protrude through one or both sides of the sandwich of circuit boards. Caul plates are then placed on the outer sides of the circuit board sandwich and pressed together so that the soft gold is compressed within the plated holes, causing the soft gold to deform against the inner surface of the plated holes to form an electrical connection between the circuit boards.

BRIEF DESCRIPTION OF THE DRAWINGS

In the drawings, where like numerals identify like components throughout the several views.

FIG. 4a is a closeup view of a single ball-bonded flying lead prior to compression within the plated hole of the circuit board.

FIG. 5a is a closeup view of a ball-bonded flying lead that has been compressed into a plated hole on the circuit board.

DETAILED DESCRIPTION OF THE PREFERRED EMBODIMENT

The preferred embodiment of the present invention relates to the high-density packing of silicon or gallium arsenide (GaAs) integrated circuit chips on single-layer or multi-layer interconnect printed circuit boards with plated-through via holes and the high-density packing of circuit boards in a sandwiched arrangement. The application of this technology is designed for speed improvements, improved heat dissipation, and improved packing density required for modern supercomputers such as the Cray-3 manufactured by the assignee of the present invention.

The placing of the integrated circuit chips or dice directly on the circuit boards eliminates the bulky packaging normally found on integrated circuits and typically referred to as DIPs (dual inline packages), SIPs (single inline packages), SMDs (surface mount devices), leadless chip carriers, and the like. All of the aforementioned packages consume valuable circuit board real estate and in turn cause increased propagation delay between active circuits due to long signal paths. In addition, the aforementioned circuits present heat dissipation barriers which vary with the thermal conductivity of the packaging material. By removing the chips from the packages and placing them directly on the circuit boards, the integrated circuit chips or dice can be surrounded by liquid coolant to improve cooling.

Flying Lead Construction

Figure 1:
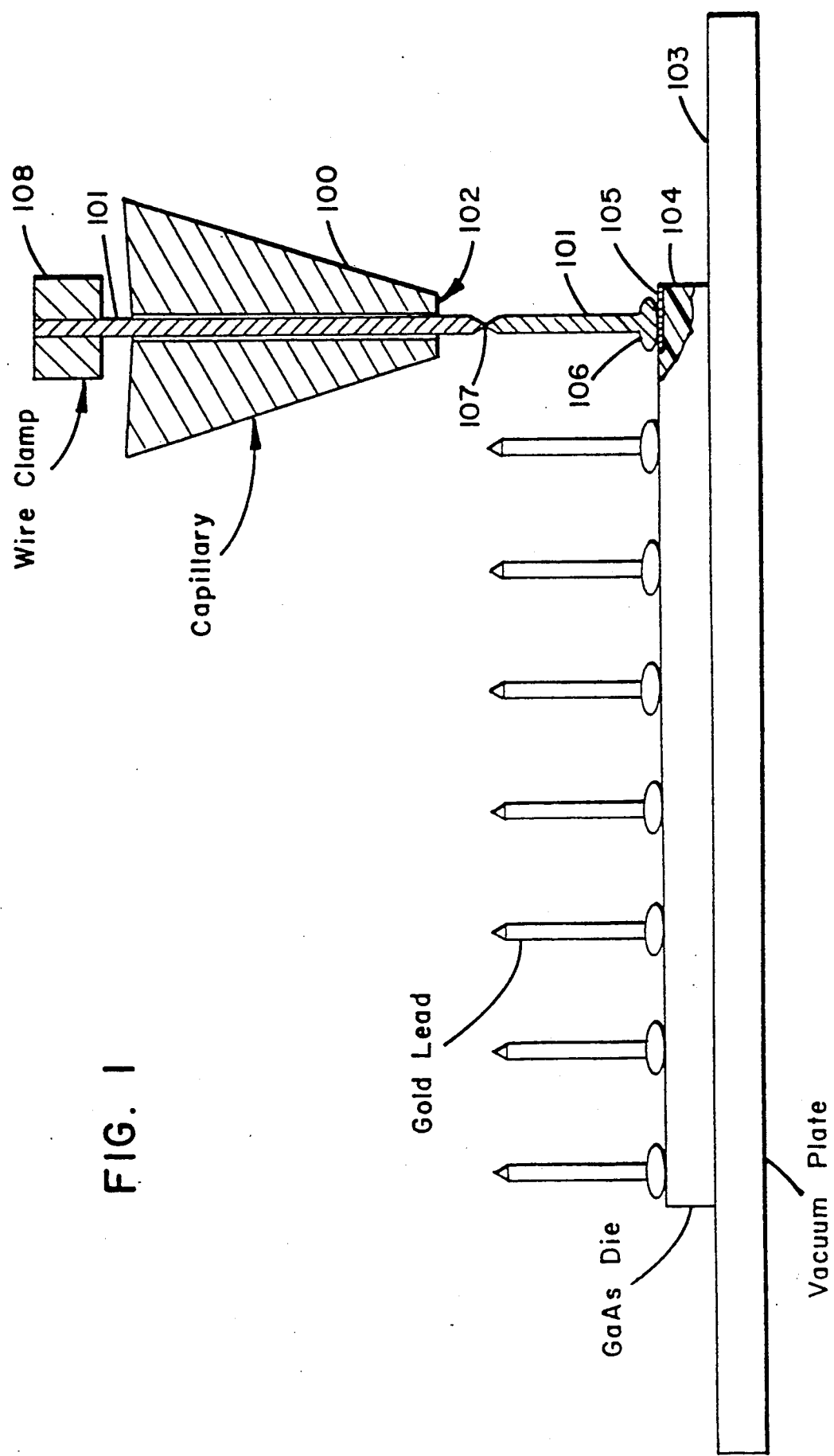
FIG. 1 is a side view of an integrated circuit die onto which flying gold leads are ball bonded and straightened by a ball bonding machine.

FIG. 1 shows the preferred embodiment for attaching the flying gold leads to the silicon or gallium arsenide packaged chip or die before attaching the die to the circuit board. The leads are made of soft gold wire which is approximately 3 mils in diameter. The GaAs chips used in the preferred embodiment contain 52 bonding pads which have a sputtered soft gold finish. The objective of the die bonding operation is to form a gold-to-gold bond between the wire and the pad. A Hughes automatic thermosonic (gold wire) ball bonding machine Model 2460-II is modified in the preferred embodiment to perform this operation, and is available from Hughes Tool Company, Los Angeles, Calif. This machine was designed and normally used to make pad-to-lead frame connections in IC packages and has been modified to perform the steps of flying lead bonding as described below. The modifications include hardware and software changes to allow feeding, flaming off, bonding and breaking heavy gauge gold bonding wire (up to 0.0030 dia. Au wire).

The Hughes automatic ball bonding machine has an X-Y positioning bed which is used to position the die for bonding. The die is loaded on the bed in a heated vacuum fixture which holds up to 16 dice. The Hughes bonding machine is equipped with a vision system which can recognize the die patterns without human intervention and position each bonding pad for processing. An angular correction as well as an X-Y position is available to the machine.

The soft gold wire that is used for the flying leads in the preferred embodiment of the present invention is sometimes referred to as sticky gold or tacky gold. This gold bonding wire is formed from a 99.99% high-purity annealed gold. The process of annealing the high-purity gold results in a high elongation (20-25% stabilized and annealed), low tensile strength (3.0 mil., 50 gr. min.) gold wire which is dead soft. The wire composition (99.99% pure Au non-Beryllium doped) is as follows:

| Gold | 99.990% min. |
|---|---|
| Beryllium | 0.002% max. |
| Copper | 0.004% max. |
| Other Impurities (each) | 0.003% max. |
| Total All Impurities | 0.010% max. |

This type of gold is available from Hydrostatics (HTX grade) or equivalent.

Referring to FIG. 1, the flying lead die bonding procedure begins with the forming of a soft gold ball at the tip of the gold wire. The wire is fed from a supply spool (not shown) through a nitrogen-filled tube 109 (shown in FIG. 2) to a ceramic capillary 100. The inside of the capillary is just slightly larger than the wire diameter. The nitrogen in the connecting tube 109 can be driven either toward the capillary or away from the capillary toward the supply spool. This allows the gold wire to be fed or withdrawn from the capillary tip.

The gold ball 106 formed at the end of the gold wire 101 is thermosonically bonded to bonding pad 105 of chip 104. The capillary tip 102 of capillary 100 is capable of heating the ball bond to 300° C. concurrent with pressing the ball 106 onto the pad 105 and sonically vibrating the connection until a strong electrical and mechanical connection is formed. The capillary 100 is then withdrawn from the surface of the die 104 and the wire 101 is extruded from the tip 102. A notching mechanism, added to the Hughes ball bonder to perform the specific notching operation described herein, is used to make a notch 107 at the appropriate height of the flying lead to break the connection and to stiffen the lead. Wire clamp 108 grasps the gold wire 101 and the capillary is withdrawn upward, breaking the flying lead at 107 and concurrently performing a nondestructive test of the ball bond to bonding pad connection.

Figure 2:
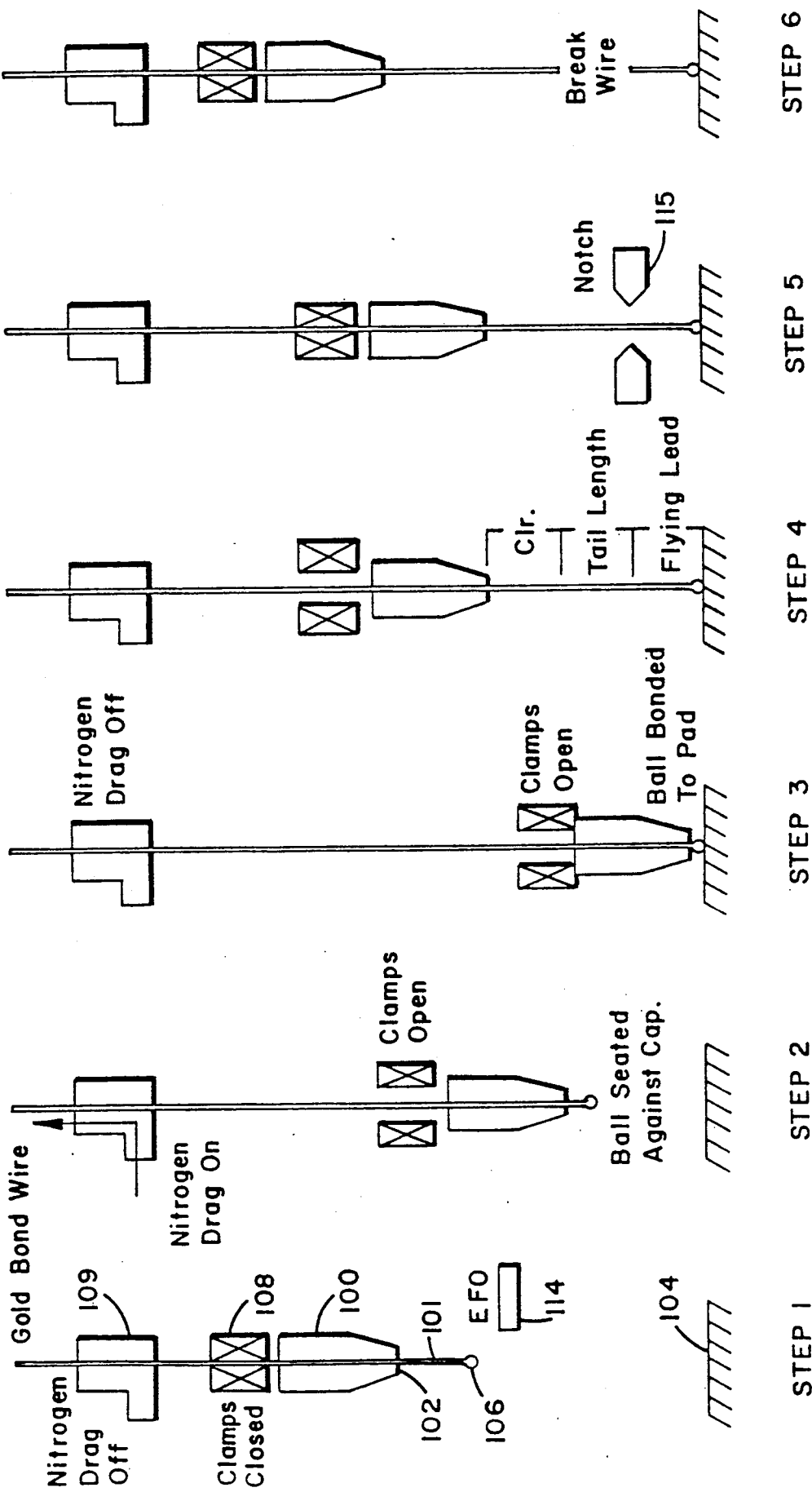
FIG. 2 shows the six steps that the flying lead ball bonder performs in order to attach a flying lead to an integrated circuit die.

The sequence of steps required to make a flying lead bond to the package die is shown in FIG. 2. Step 1 begins with the feeding of a predetermined amount of wire through the capillary 100. A mechanical arm then positions an electrode 114 below the capillary tip 102 and a high-voltage electrical current forms an arc which melts the wire and forms a gold ball with a diameter of approximately 6 mils. This is termed electrostatic flame-off (EFO). Specified ball size range is attainable through EFO power supply output adjustment up to 10 milliamps. During this step, the clamps 108 are closed and the nitrogen drag is off. This action occurs above the surface of the integrated circuit chip so as to avoid any damage to the chip during the EFO ball forming process.

In step 2, the nitrogen drag 109 withdraws the supply wire 101 into the capillary 100 and tightens the ball against the capillary tip 102.

The capillary tip 102 is heated to 200° C. (range of ambient to 300° C.) to assist in keeping the gold wire 101 in a malleable state. The die fixture is also heated to 200° C. (range of ambient to 300° C.) to avoid wire cooling during the bonding process. The die fixture is made of Teflon-coated aluminum. As shown in FIG. 1, a vacuum cavity or vacuum plate 103 holds the die 104 in position on the fixture during the bonding process.

In step 3, the bonding machine lowers the capillary 100 to the surface of a bonding pad 105 and applies high pressure (range of 30–250 grams) to the trapped gold ball 106 along with ultrasonic vibration at the capillary tip 102. The capillary tip 102 is flat, with a 4-mil inside diameter and an 8-mil outside diameter. The ball 106 is flattened to about a 3-mil height and a 6-mil diameter. Ultrasound is driven through the ceramic capillary 100 to vibrate the gold ball 106 and scrub the bonding pad surface. The sound is oriented so that the gold ball 106 moves parallel to the die surface. The Hughes ball bonding machine has the ability to vary the touch-down velocity, i.e., soft touch-down for bonding GaAs, which is program selectable. The ultrasonic application is also program selectable.

In step 4, the capillary 100 is withdrawn from the die surface 104, extending the gold wire 101 as the head is raised. The nitrogen drag is left off and the capillary is raised to a height to allow enough gold wire to form the flying lead, a tail length for the next flying lead, and a small amount of clearance between the tail length and the capillary tip 102. The Hughes ball bonder device is capable of selecting the height that the capillary tip can move up to a height of approximately 0.750 inch.

In step 5, an automatic notching mechanism 115 moves into the area of the extended gold wire 101 and strikes both sides of the wire with steel blades. This is essentially a scissor action which cuts most of the way through the gold wire 101, forming a notch 107. The notch 107 is made 27 mils above the surface of the die. The notching mechanism has been added to the Hughes ball bonder for the precise termination of the flying leads. The Hughes ball bonder has been modified to measure and display the notch mechanism height. The activation signal for the notch mechanism is provided by the Hughes ball bonder system for the proper activation during the sequence of ball bonding The flying lead length is adjustable from between 0.0 mils to 50.0 mils. It will be appreciated by those skilled in the art that the notching function can be accomplished with a variety of mechanisms such the scissor mechanism disclosed above, a hammer-anvil system, and a variety of other mechanisms that merely notch or completely sever the wire 101.

In step 6, clamp 108 closes on the gold wire 101 above the capillary 100 and the head is withdrawn until the gold wire breaks at the notched point. This stretching process serves several useful purposes. Primarily, the gold wire is straightened by the stretching force and stands perpendicular to the die surface. In addition, the bond is non-destructively pull-tested for adhesion at the bonding pad. The lead 101 is terminated at a 27-mil height above the die surface 104 in the preferred embodiment. At the end of step 6, the capillary head for the bonding mechanism is positioned over a new bonding pad and the process of steps 1–6 begin again. The bonding wire 101 is partially retracted into the capillary once again, and the clamps are closed, as shown in step 1, so that a new ball may be formed by the EFO.

The die positions are roughly determined by the loading positions in the vacuum fixture. The Hughes automatic bonding machine is able to adjust the X-Y table for proper bonding position of the individual die. An angular correction is automatically made to adjust for tolerance in placing the die in the vacuum fixture. This is done through a vision system which recognizes the die pad configurations. Using the modified Hughes automatic bonding machine with the current bonding technique, a minimum bonding rate of 2 die pads per second is possible.

Circuit Board Construction

Figure 3:
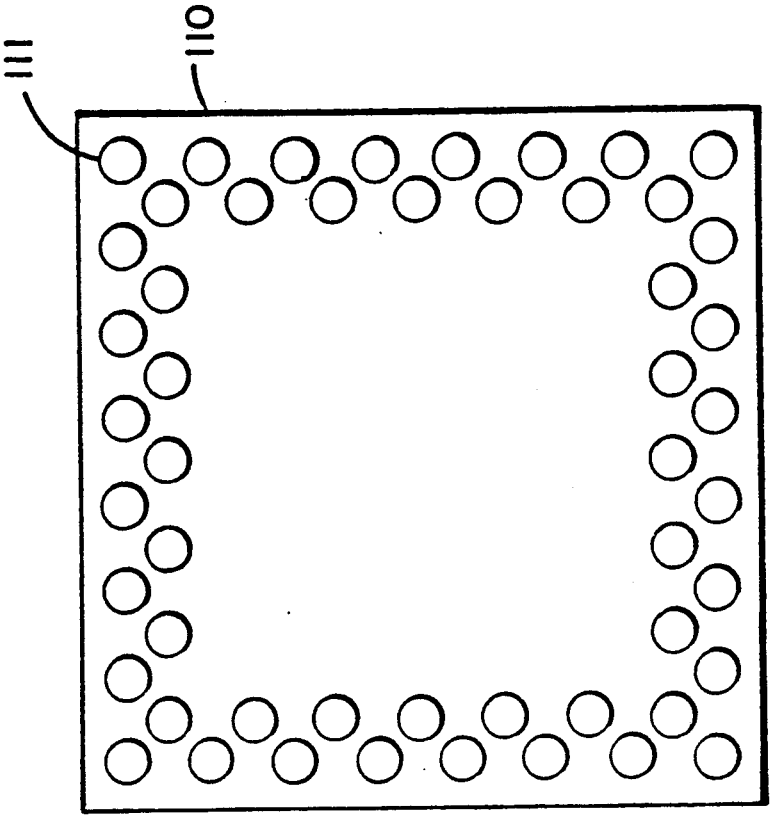
FIG. 3 shows the bonding pad pattern on a typical integrated circuit along with the corresponding plated hole pattern on a circuit board which mates the integrated circuit chip to the circuit board.
Figure 3:
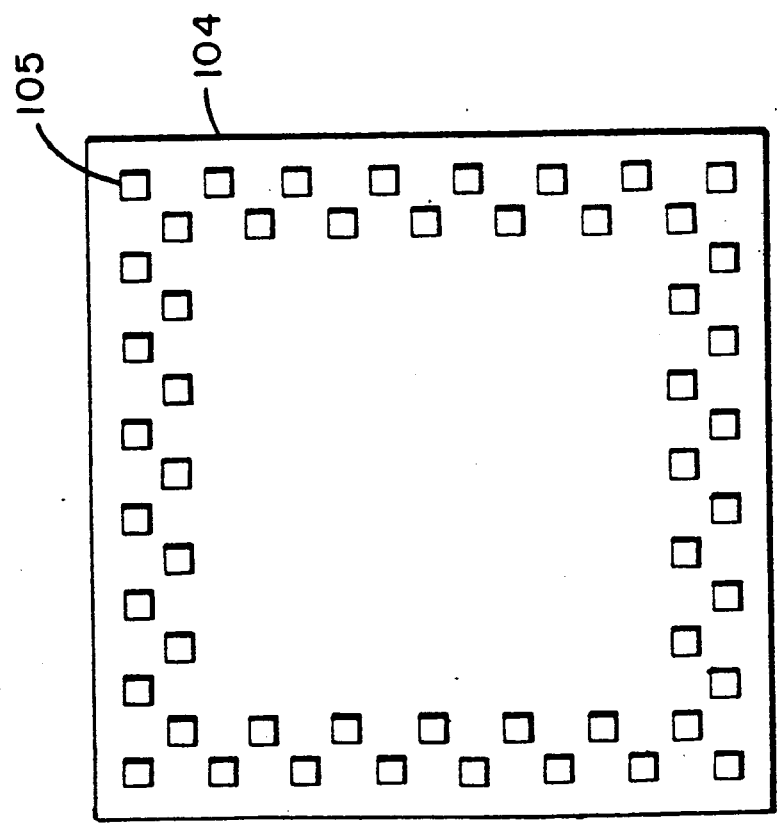

Once the gold bonding leads are attached to the integrated circuit chip or die, the die is ready to be attached to the circuit board. As shown in FIG. 3, the bonding pattern of the integrated circuit die 104 matches the plated hole pattern on the circuit board 110. For example, the top view of integrated circuit die 104 in FIG. 3 shows the bonding pad 105 in the upper right corner. The circuit board 110 shown in FIG. 3 shows a corresponding plated hole 111 which is aligned to receive the bonding lead from bonding pad 105 when circuit board 110 is placed over integrated circuit 104 and the flying leads are inserted into the hole pattern on the circuit board. Thus, each bonding pad of integrated circuit 104 has a corresponding plated hole on circuit board 110 aligned to receive the flying leads.

The circuit board assembly operation begins with the die insertion in the circuit board. The circuit board is held in a vacuum fixture during the insertion process. This is to make sure that the board remains flat. Insertion can be done by hand under a binocular microscope or production assembly can be done with a pick-and-place machine.

Figure 4:
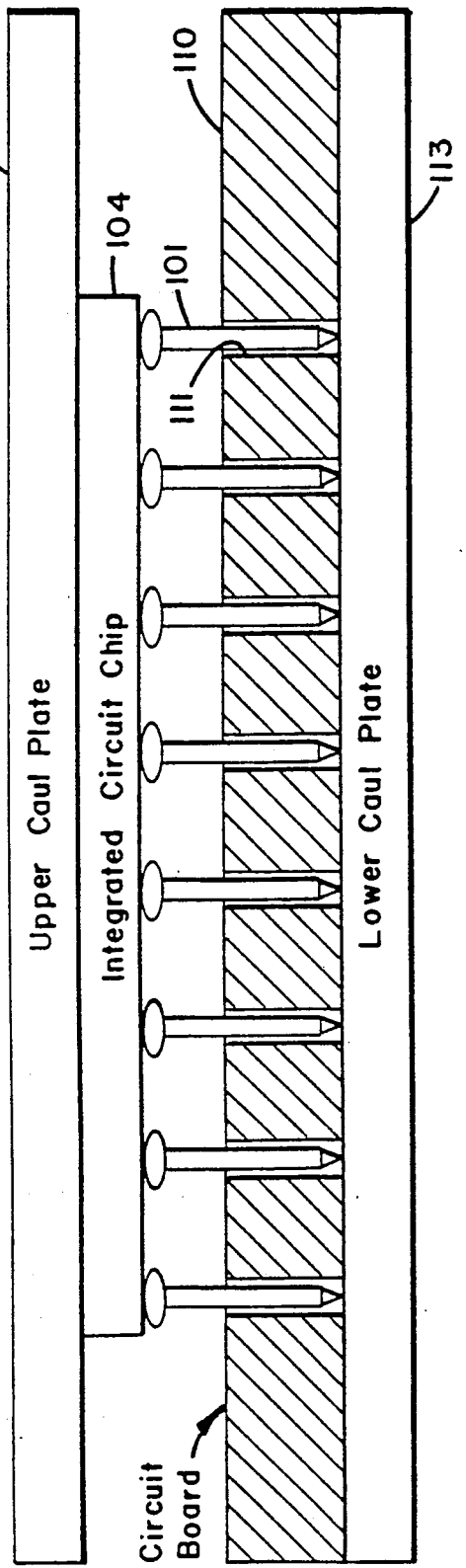
FIG. 4 shows the relative positions of the integrated circuit chip and the circuit board prior to compression of the flying leads into the plated holes.

Referring to FIG. 4, the circuit board 110 with the loosely placed die 104 is mounted on an aluminum vacuum caul plate (lower caul plate) 113. Steel guide pins (not shown) are placed in corner holes of the circuit board to prevent board motion during the assembly operation. A second (upper) caul plate 112 is then placed on the top side of the circuit board populated with chips to press against the tops (non-pad side) of the chips 104. The sandwich assembly comprising the circuit circuit board, the chip and the caul plates is then placed in a press and pressure is applied to buckle and expand the gold leads 101 in the plated holes 111 of the circuit board.

Figure 5:
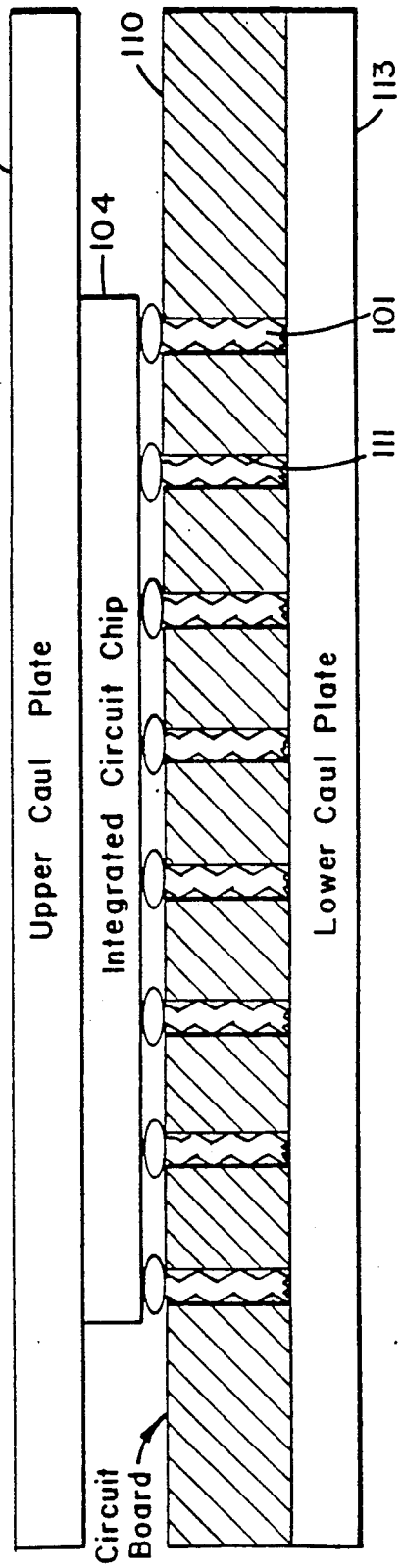
FIG. 5 shows the relative positions of the integrated circuit chip and the circuit board after the flying leads have been compressed inside the plated holes of the circuit board.

The side view of the sandwiched circuit board 110, integrated circuit chip 104, and caul plates 112 and 113 in FIGS. 4 and 5 illustrates the position of the gold leads 101 before and after the pressing operation, respectively. In the preferred embodiment there is a 7-mil exposure of gold lead 101 which upon compression will buckle and expand into the plated hole 111 of the circuit board 110. The 3-mil diameter wire 101 in a 5-mil diameter hole 111 means the initial fill is 36 percent of the available volume. After pressing, the fill has increased to 51 percent as a result of the 7-mil shortening of the gold lead 101. As shown in greater detail in FIGS. 5 and 5a, the lead typically buckles in two or more places, and these corners are driven into the sides of the plated hole 111 of the circuit board. The assembly is completed in one pressing operation. The circuit board 110 can now be removed from the press with the integrated circuit chip 104 securely attached and electrically bonded to the plated holes of the circuit board.

Figure 6:
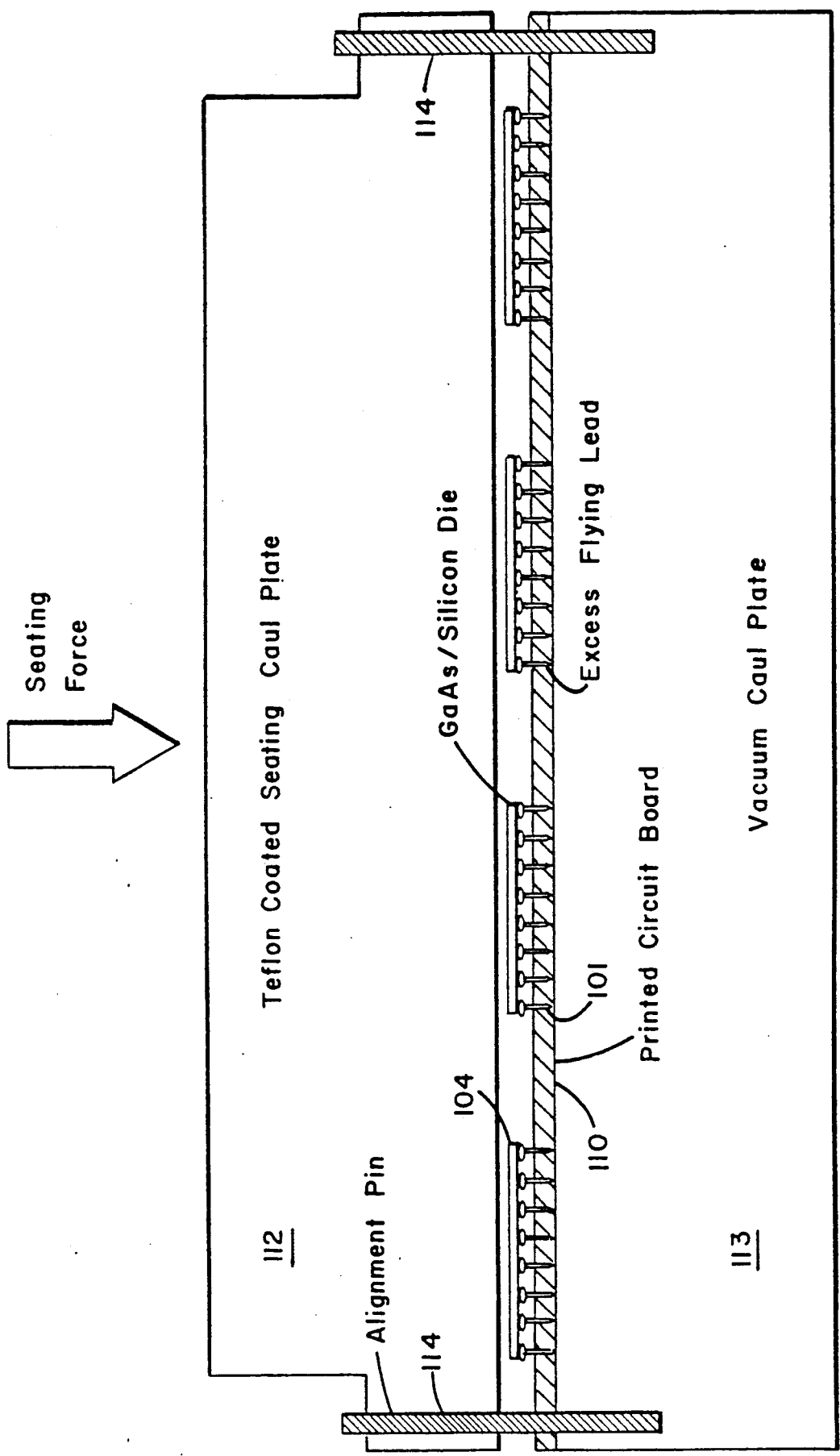
FIG. 6 is a larger view of the compression process whereby a plurality of integrated circuit chips having flying leads are attached to a single printed circuit board through the application of seating force on caul plates which sandwich the circuit board/chip combination.

FIG. 6 shows a broader view of the circuit board press which is used to attach the integrated circuits to the printed circuit board. The upper caul plate 112 is a Teflon-coated seating caul plate which is aligned through alignment pins 114 with the circuit board 110 and the lower caul plate 113 which is vacuum caul plate to hold the circuit board flat during the pressing process. The alignment pins 114 are used to prevent the printed circuit board 110 from sliding or otherwise moving during the pressing process. A seating force is applied to the top of upper caul plate 112 which forces the excess flying lead material into the plated holes of printed circuit board 110. Thus, integrated circuits 104 are mechanically and electrically bonded to printed circuit board 110.

It will be appreciated by those skilled in the art that many variations of the above-described pressing operation can be used which results in the same or equivalent connection of the flying leads to the PC boards. For example, the flying leads of the chips could be completely inserted into the through-plated holes of the PC board prior to the pressing operation with the excess gold leads protruding out the opposite side. The first caul plate could then be used to hold the chip onto the PC board while the second caul plate is used to compress the leads into the holes.

Module Assembly Construction

A sandwiched assembly of printed circuit boards populated with integrated circuit chips is interconnected using a technique similar to that used in bonding the integrated circuit chips to the circuit boards. As is more fully described below, soft mold wires are inserted through axially aligned plated holes between layered circuit boards which are compressed using caul plates to partially fill the plated holes with the soft gold wires to form an electrical connection substantially perpendicular to the planar surfaces of the printed circuit boards.

Figure 7:
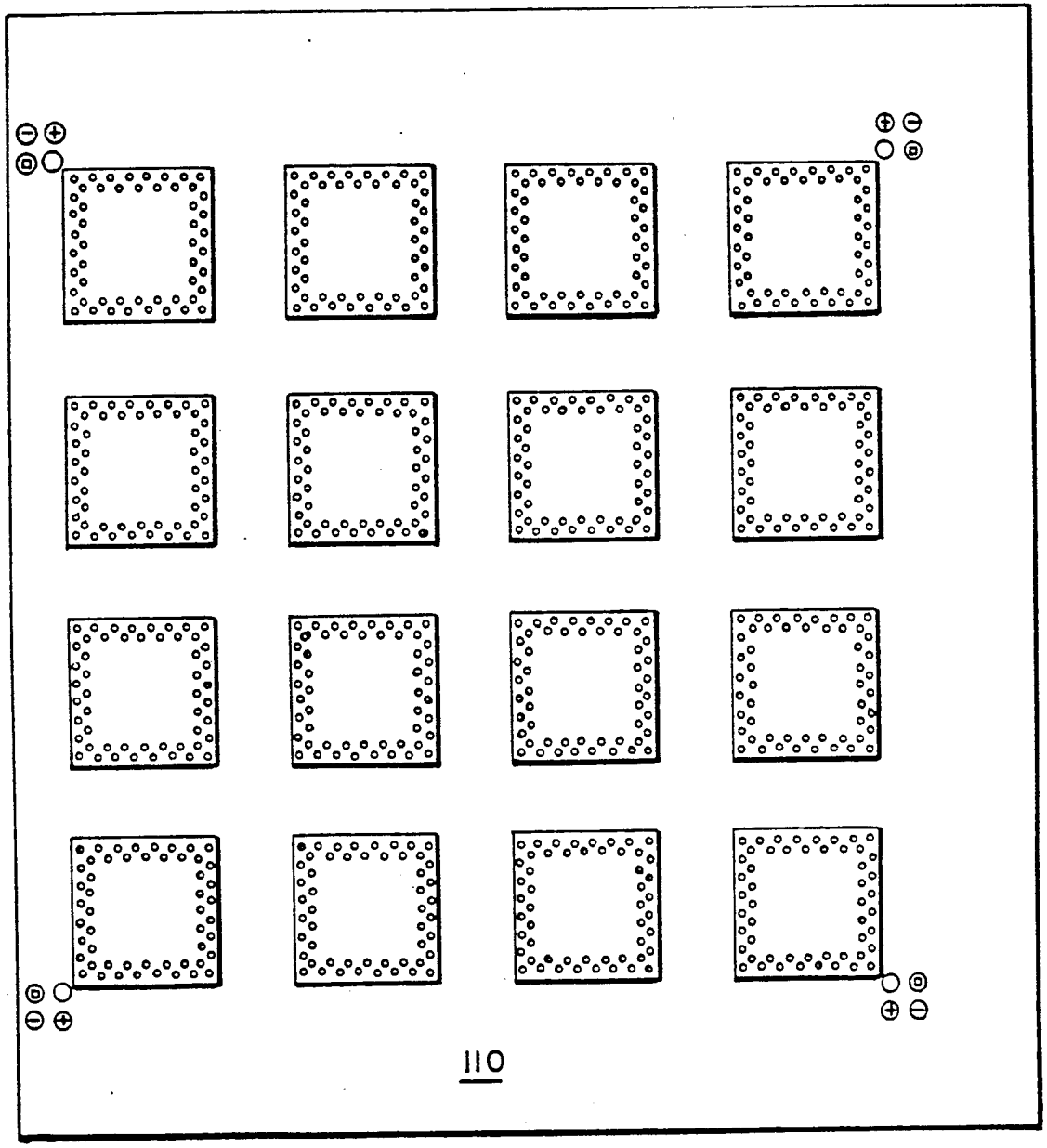
FIG. 7 is a plated hole pattern for a typical PC board onto which integrated circuit dice are attached in the preferred embodiment of the present invention.

FIG. 7 is an example of a printed circuit board hole pattern for the type of circuit boards used in the Cray-3 computer manufactured by the assignee of the present invention. In the preferred embodiment of the present invention, each circuit board provides 16 plated hole patterns for the acceptance of 16 integrated circuits having flying leads. The 16 integrated circuits are attached to each of the circuit boards of the type found in FIG. 7 through the pressing process previously described for circuit board assembly. Caul plates of a size slightly larger than the circuit boards of the type shown in FIG. 7 are used during the pressing process to attach the integrated circuit chips to the circuit boards. Each plated hole pattern on circuit board 110 of FIG. 7 corresponds to the hole pattern disclosed in FIG. 3. Each corner of circuit board 110 includes four plated via holes which are used to distribute power and are used for alignment during the pressing operation.

Figure 8:
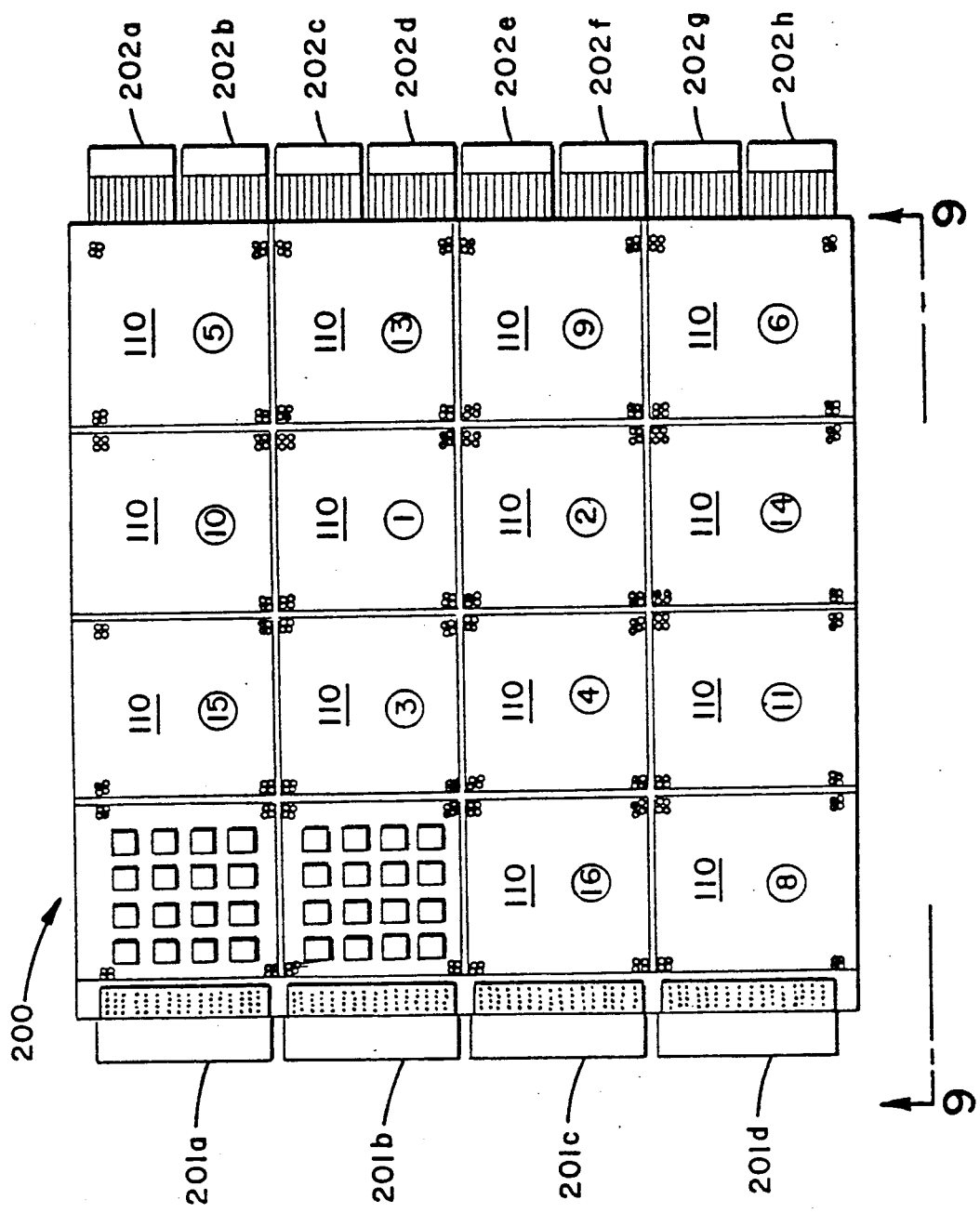
FIG. 8 is a module assembly onto which a plurality of circuit boards populated with integrated circuit chips are placed.

In the preferred embodiment of the present invention, 16 of the circuit boards 110 shown in FIG. 7 are arranged in a module assembly 200 of the type shown in FIG. 8. The circuit boards 110 are arranged in a $4 \times 4$ matrix on each level of the module. There are four levels of the module in which circuit boards are stacked, thus created an X-Y-Z matrix of $4 \times 4 \times 4$ circuit boards. This results in 64 circuit boards for each module assembly 200 which in turn results in 1,024 integrated circuit chips per module assembly.

A module assembly is 4.76 inches wide, 4.22 inches long, and 0.244 inch thick. A top view of a module assembly is shown in FIG. 8. At one edge of the module assembly are four power blades 201a-201d. Each of the power blades is one example of means for applying electrical power to a power plate to which the power blade is connected. These machined metal blades are both the mechanical connection to the cabinet into which the module assemblies are placed and the electrical connection to the power supplies, as a result of fitting into an electrical power input connector. At an opposite edge of the module assembly are 8 signal edge connectors 202a-202h. These connectors form the communication paths to the other module assemblies within the machine.

Electrical communication between the integrated circuit chips of each board 110 is accomplished by means of the prefabricated foil or conductor patterns on the surface and buried within each circuit board. The electrical communication between circuit boards 110 is between two logic boards or plates sandwiched in the center of the module assembly. Communication between the circuit boards and the logic plates is through gold post jumpers along the Z-axis direction perpendicular to the planar surface of the circuit boards and the module assembly. The z-axis jumper wires are used for distribution of electrical communication signals and power distribution. The Z-axis jumpers are placed in any of the area on circuit boards 110 that is not occupied by an integrated circuit.

Due to the amount of force required to compress the jumpers along the Z-axis of the module assembly, the jumpers are compressed for a 4-board stack at one of the 16 locations on the module 200 at a single time. The order in which the circuit boards are compressed is shown in FIG. 8 in the lower left corner of each circuit board stack 110. Sixteen separate pressings are performed to compress the gold Z-axis jumpers for one module 200.

Figure 9:
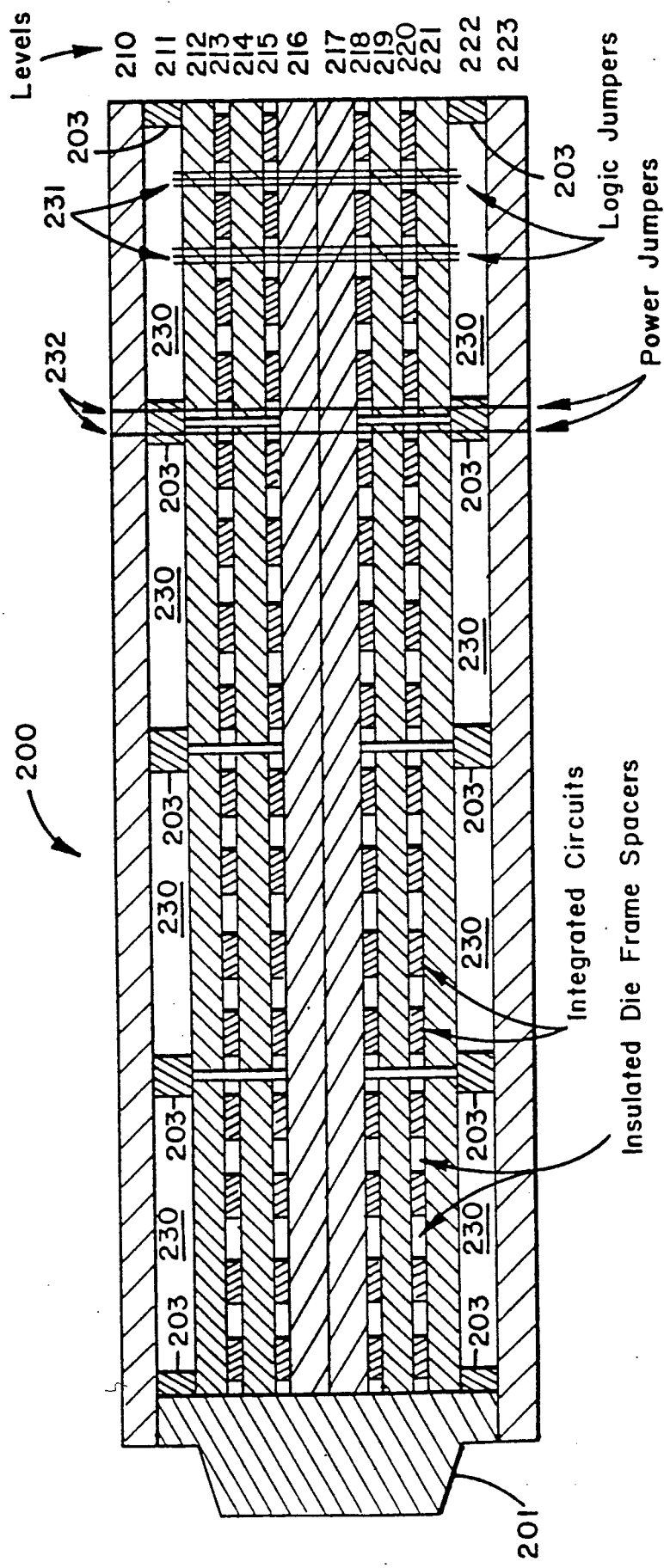
FIG. 9 is a side view of the module assembly of FIG. 8 showing the details of the logic jumpers and power jumpers for logic and power interconnection between the sandwich assembly of printed circuit boards.

FIG. 9 shows a side sectional view of a module assembly The assembly 200 is constructed as a sandwich comprising four layers of circuit boards, two layers of circuit board interconnect layers, and several layers of support framing material. FIG. 9 depicts a completely assembled module assembly with the exception of the single edge connectors, which have been omitted for purposes of this discussion. The assembly 200 in application is stacked with other assemblies in a fluid cooling tank and positioned so that the planar surface of the module assembly is stacked in a vertical direction. Thus, in application, the view of the circuit board assembly 200 of FIG. 9 is actually a top-down look at the module in application. A type of cooling apparatus suitable for cooling the circuit board module assemblies of the present invention is described in U.S. Pat. No. 4,590,538 incorporated herein by reference.

Eight cooling channels 230 are provided at the outer sections of the module assembly to allow the vertical rise of cooling fluid through the module assembly to remove the excess heat produced by the integrated circuits in operation. Heat transfer occurs between circuit boards 1 and 4 (levels 212 and 221 respectively) and the fluid passing through channels 230. There is also heat transfer from the ends of logic jumpers 231 to the passing fluid in channels 230. The latter is the primary heat transfer vehicle from circuit boards 2 and 3 (levels 214 and 219, respectively). The power plates at levels 210 and 223 are spaced from the board stacks to form the fluid channels. Spacing is accomplished with acrylic strips 203 which are held in place by the power jumpers 232.

The module assembly 200 as shown in FIG. 9 depicts at 201, the one of the four power blades 201d shown to the left as shown in FIG. 8. The outer plates shown as layers 210 and 223 (FIG. 9) are power distribution plates which connect to the four power blades (FIG. 8) and are used to distribute electrical power throughout the module for powering the integrated circuits. The connection between the integrated circuits and the power plates is by Z-axis power jumpers which are described in more detail below.

As was previously described, each module assembly consists of 16 board stacks. Each board stack consists of four circuit boards. The side edge view of the module assembly shown in FIG. 9 shows four board stacks exposed in a cut-away view. The four circuit board levels are labeled Nos. 212, 214, 219 and 221. Electrical signal communication between these boards is via two logic plates labeled 216 and 217. These plates are in the center of the module assembly and divide the board stacks in half. Communication between circuit boards 212, 214, 219 and 221 and logic plates 216 and 217 is via gold post jumpers or logic jumpers 231 in the Z-axis direction (relative to the X-Y axes lying on the planar surface of the circuit boards and logic plates). The logic plates as well as the circuit boards contain electrical interconnecting plated wiring conductor patterns in the X-Y direction, and the Z-direction interconnect is thus performed by the logic jumpers.

The integrated circuits 104 are shown in FIG. 9 as the rectangles at levels 213, 215, 218 and 220. The flying leads from these integrated circuits are attached to circuit boards 212. 214, 219 and 221 respectively. Thus, the circuit board assembly of 212 with integrated circuits at level 213 are assumed to have been previously assembled with the aforementioned flying lead attachment of integrated circuits to circuit boards. The spaces between the integrated circuits at levels 213, 215, 218 and 220 contain through-plated holes which are axially aligned in the Z-axis direction and allow the gold post logic jumpers 231 to pass through the various levels of the module. The spaces between the integrated circuits on levels 213, 215, 218 and 220 are filled with a die frame which also contains corresponding axially aligned holes. This is a clear acrylic plate or block the size of the circuit boards approximately 10 mils thick. There are relief areas in the die frame for the integrated circuit packages and for the gold post jumpers which pass through the board stacks and through the die frames. The purpose of the die frame is to provide mechanical support for the circuit boards and for the gold post jumpers.

The jumpers are forced through the board stack under high pressure to interconnect all of the axially aligned through-plated holes on the circuit boards and on the logic plates. The gold jumpers 231 are made of the same soft gold used in the flying lead connection of the integrated circuit packages to the circuit boards described above. The soft gold jumpers are compressed through the axially aligned plated holes to form electrical connections in the Z-axis direction. The die frame prevents the soft gold of the jumper from escaping into the areas between the circuit boards adjacent the integrated circuits.

Jumpers 231 in FIG. 9 are similar to the power jumpers 232 also shown in FIG. 9. The power jumpers 232 extend farther than the logic jumpers 231, since they need to connect to power plates 210 and 223 to supply power to the circuit boards.

Figure 10:
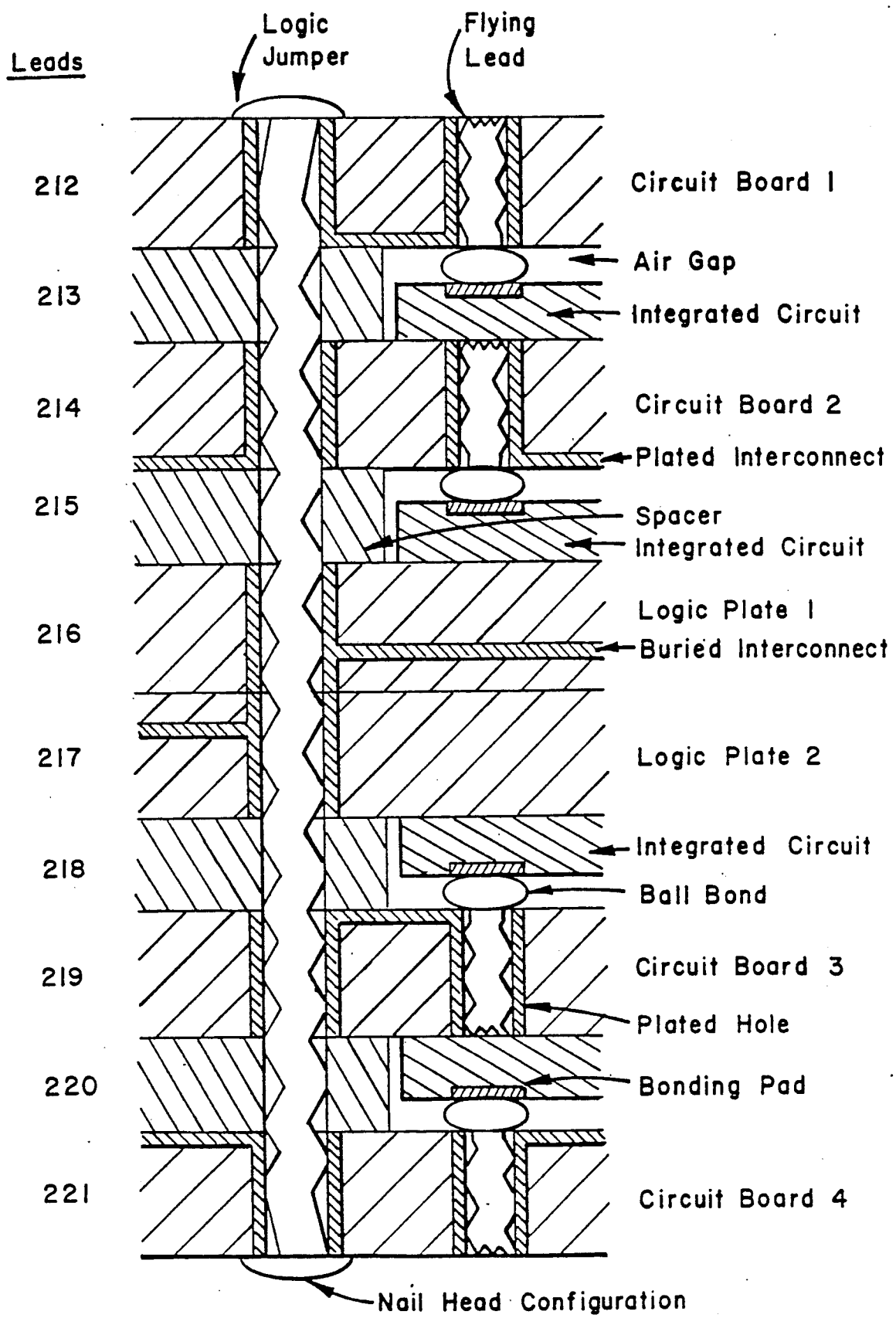
FIG. 10 is closeup view of a single logic jumper that has been compressed within the axially aligned plated holes of the sandwiched printed circuit boards of the module assembly of FIG. 9.

FIG. 10 shows a closeup view of a single logic jumper through the various levels of assembly 200. This cross-sectional view at FIG. 10 is not drawn to scale and is offered as an illustration of how the gold leads are compressed within the plated holes of both the circuit boards and the logic plates. Spacers are used at levels 213, 215, 218 and 220 to prevent the gold jumper leads from expanding into the spaces between the circuit boards. Buried plated interconnect or surface interconnect on circuit boards and logic plates form the interconnection between the logic jumpers and the plated holes for the flying leads of integrated circuits. Logic or electrical communication between integrated circuits and the outside world is achieved therefrom. Insulating openings such as the axially aligned holes in the insulated die frame spacers are also provided in the circuit boards and logic boards for the jumpers to pas through to achieve electrical communication through a board without electrical connection to that board whenever such an electrical path is desired between two or more boards which are not adjacent in the assembly. This situation is illustrated by the power jumpers 232 passing through the logic boards 216 and 217, as shown in FIG. 9, but may also occur when one logic jumper 231 passes through one of the circuit boards and makes electrical contact with an adjacent circuit board. It will be appreciated by those skilled in the art that power jumpers will appear similar to the logic jumpers shown in FIG. 10, except that the power jumpers extend into the power plates of the assembly 200 and are somewhat larger in diameter.

Gold Post Jumper Installation

The module is assembled in two steps. The first step combines the circuit board stacks with the logic plates. This step is repeated 16 times for a module (once for each board stack). The second step connects the power plates and the module power blades. Both steps are described below.

Figure 11:
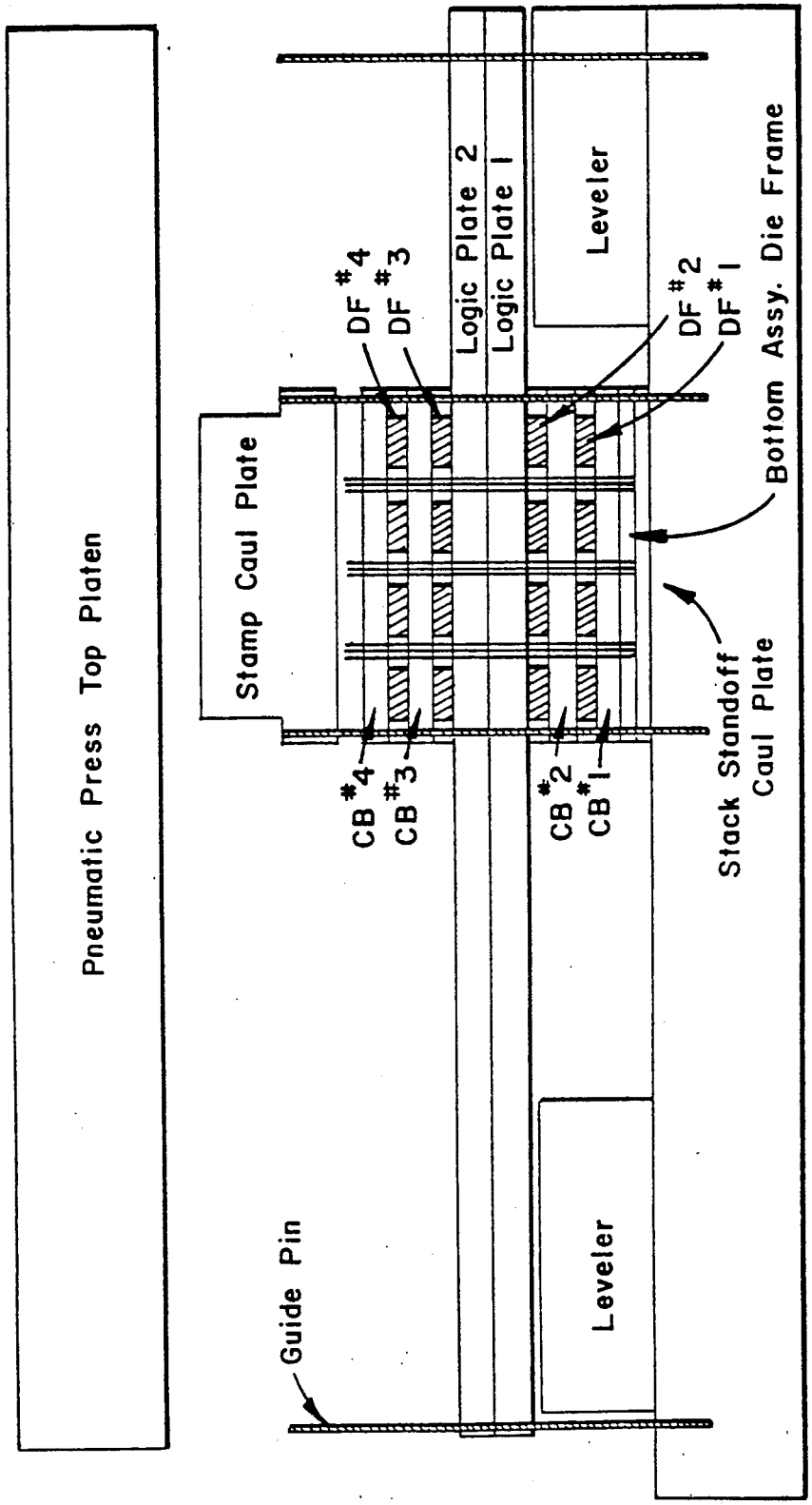
FIG. 11 shows the first two steps of the pressing operation for compressing the logic jumpers in a single stack assembly of PC boards on a module assembly.
Figure 12:
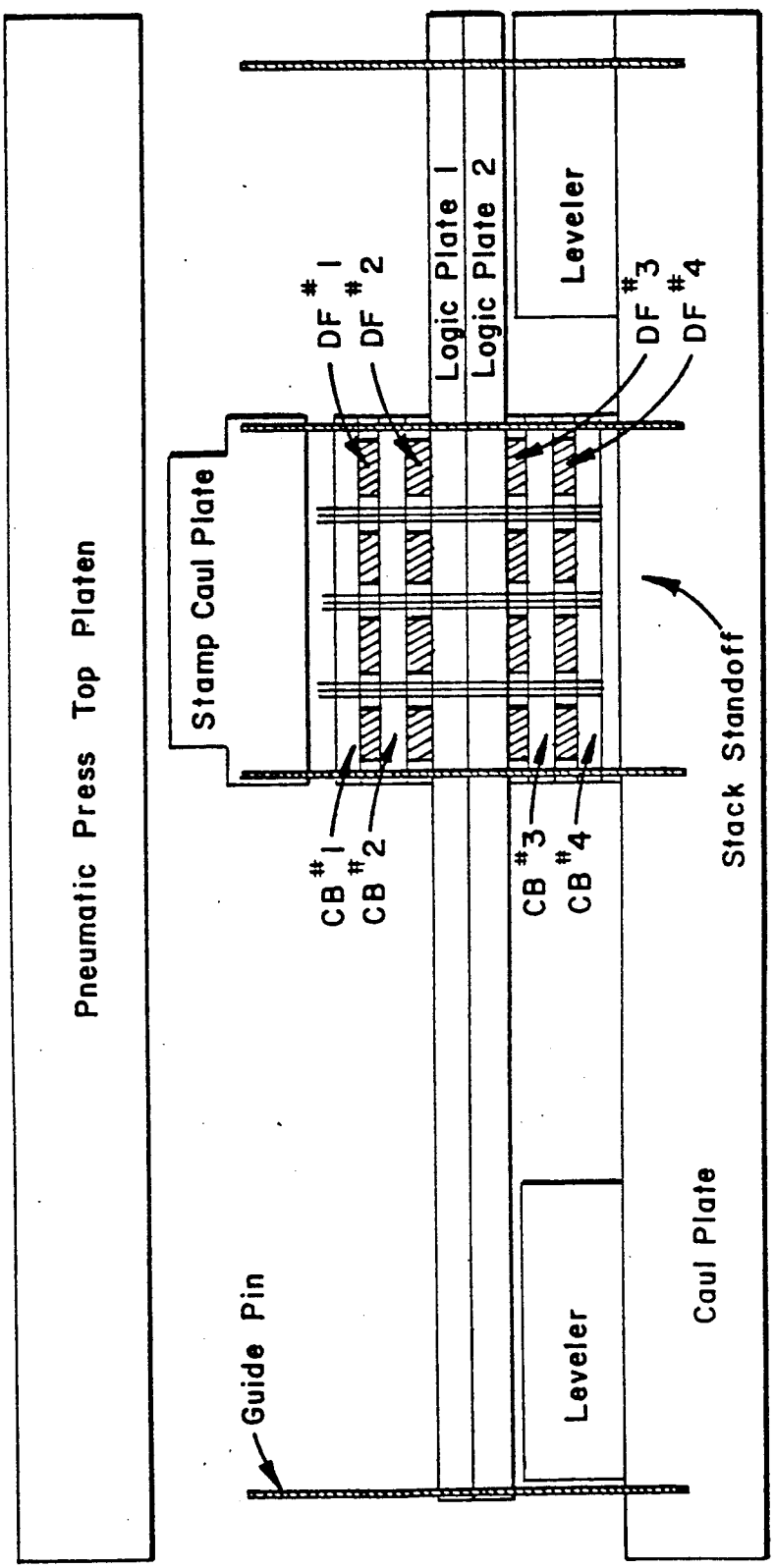
FIG. 12 shows the second two steps of the compression of the logic jumpers on a single stack assembly of four printed circuit boards on a module assembly.

The board stacks are assembled to the logic plates in two pressing operations. These pressing operations are shown in FIGS. 11 and 12. The pressing operation shown in FIGS. 13 and 14 presses the power jumpers through the assembly to form the necessary interconnect between the circuit board and logic plate layers and the power plate levels.

The four circuit boards (CB), the four die frames, (DF) and the two logic plates are stacked on a metal caul plate with guide pins through the corner power jumper holes as shown from the side view of FIG. 11. This is in preparation for the first pressing operation. There is an assembly die frame spacer on the lower caul plate below the first circuit board. There is another assembly die frame spacer on the top of the stack just below the stamp caul plate, which is removed before the first pressing.

Soft gold post jumpers are then loaded into the stack in the positions where the jumpers are desired. These gold posts are in the preferred embodiment 5 mils in diameter and 192 mils long. The top assembly die frame spacer is removed and is replaced with the stamp caul plate. The assembly is then placed in a press and the jumpers are compressed such that the exposed 10 mils of the logic jumpers are compressed into the stack assembly. In this pressing operation, the 10 mils of the exposed gold post at the top of the stack assembly are compressed into the assembly and the gold posts expand in the jumper cavity to a nearly 100 percent fill. Excess gold is forced into a nail head configuration on the top of the outside circuit board. The assembly in FIG. 11 shows the stamp caul plate on the outer surface of circuit board 4 with the top assembly die frame spacer removed.

The pressing operations shown in FIGS. 11 and 12 are accomplished using levelers on the outer surfaces of the logic plates to ensure an even pressing operation. The guide pins are placed at various points through the power jumper holes along the logic plates to ensure that the circuit boards and logic plates do not move during the pressing operation.

FIG. 12 shows the second pressing operation. The board stack shown in FIG. 11 is turned over with the caul plates reversed In the second pressing operation, the top assembly die frame spacer on the top side of the stack is now removed and another press cycle occurs, pressing the remaining 10 mils of the exposed jumper into the stack. The reason for the two-sided pressing operation is that the soft gold binds sufficiently in the jumper cavity so that it is not possible to make a reliable connection through the entire stack from one side only. The number of pressing operations of course would vary with the number of levels in the sandwiched assembly. In smaller (thinner) assemblies, one-sided pressing is possible.

With board stacks having a larger number of levels of circuit boards, logic plates and chips, longer logic jumpers and power jumpers may be used to interconnect along the Z-axis, however, more pressing operations may be required. For example, in an alternate embodiment of the present invention, four pressing operations may be required for logic jumpers The first pressing operation would be similar to that shown in FIG. 11, except that two 10-mil spacers would be placed at the bottom of the board stack and two 10-mils spacers placed at the top of the board stack. The first pressing operation would press 10 mils of the logic jumpers into the board stack after the removal of the top spacer The second step would start with the removal of the second spacer on the top, and a second pressing operation would occur. The third pressing operation would begin with the board stack flipped over and the top 10-mil spacer removed for the third pressing step. The last pressing step would begin with the removal of the final 10-mil spacer and a final pressing operation would begin. In this application, 20 mils of exposed gold jumper could be pressed into a thicker board stack.

Figure 13:
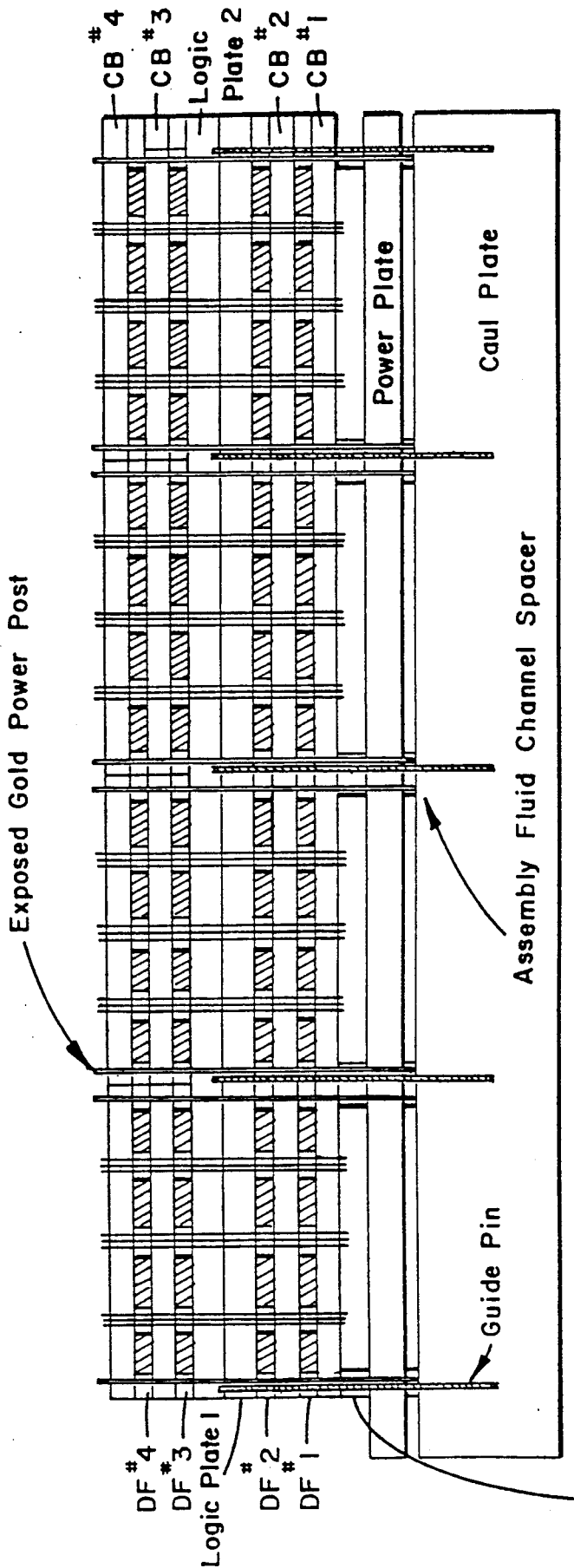
FIG. 13 shows the method of compressing the power jumpers through the assembly of stacked printed circuit boards.
Figure 14:
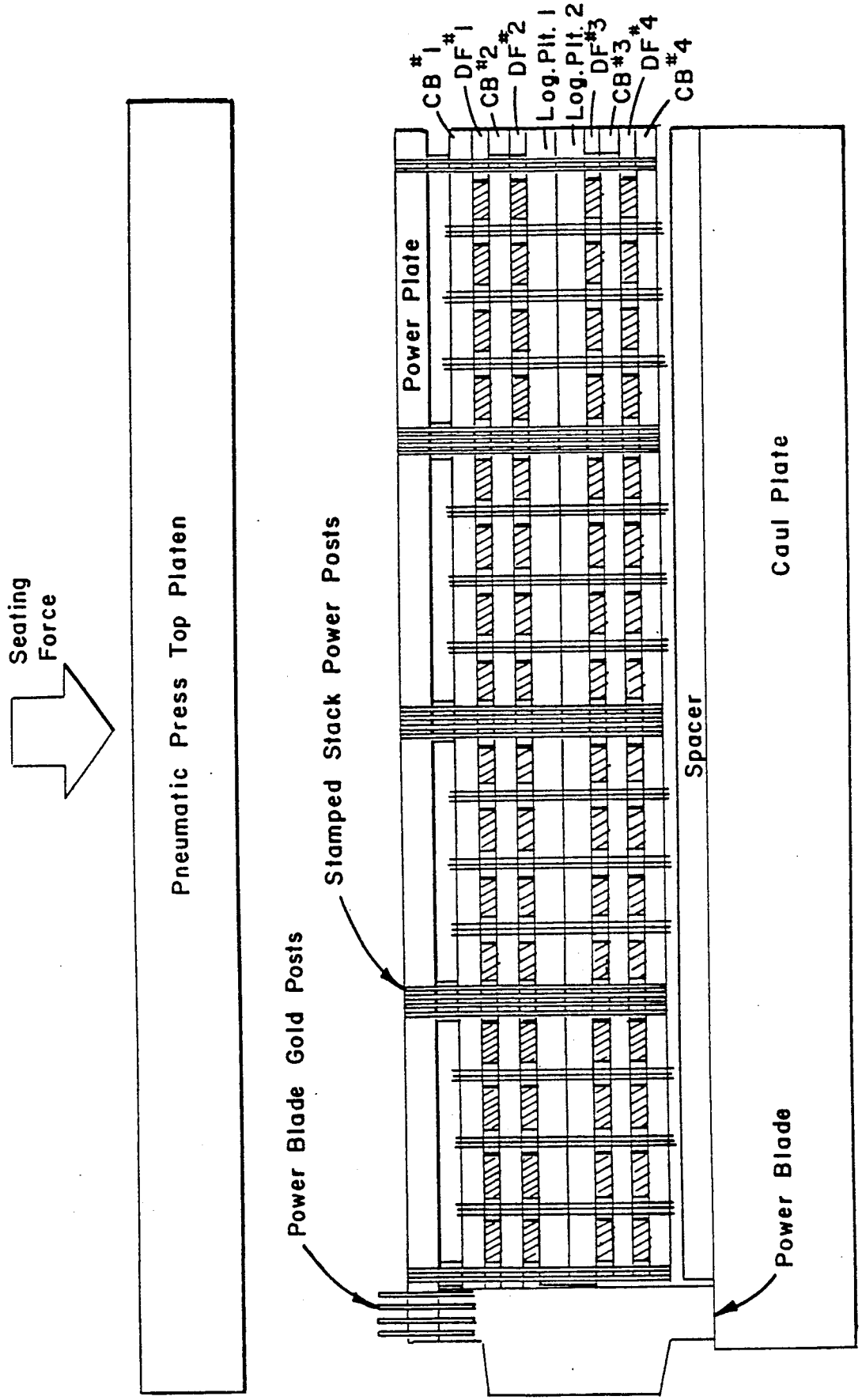
FIG. 14 shows the compression of the gold posts between the power plates and the power blades of the module assembly.

Power plates and module power blades are added to the partial module assembly in a manner similar to the pressing operation for the individual circuit board stacks. In this case, instead of a stamp caul plate of approximately the size of a single circuit board, caul plates the size of the entire assembly are used to press all of the power jumpers on the entire module assembly, as shown in FIG. 13. The power jumpers are loaded and pressed in a four-step cycle as described above for the logic jumpers of a single circuit board stack assembly. The gold posts for this power jumper pressing operation are 14 mils in diameter and 284 mils long. The module power blades are attached as a last step by pressing gold posts or aluminum posts into cavities in the machined power blades, as shown in the final step of FIG. 14.

Those of ordinary skill in the art will recognize that other types of lead bonding processes may be substituted for the ball bonding process for flying leads described herein. Also, other types of malleable electrically conductive metals may be used in place of the soft gold described herein. In addition, the pressing process causing the gold to expand or buckle within the plated holes may be performed without having the gold leads protrude from the circuit board. Compression fingers could be axially aligned with the plated holes in order to compress the gold leads within the plated holes without having the leads protruding before the process is begun.

While the present invention has described connection with the preferred embodiment thereof, it will be understood that many modifications will be readily apparent to those of ordinary skill in the art, and this application is intended to cover any adaptations or variations thereof. Therefore, it is manifestly intended that this invention be limited only by the claims and the equivalents thereof.

What is claimed is:

1. A three-dimensionally electrically interconnected circuit board module apparatus, comprising:
   a plurality of circuit boards coplanar in a plane defined by an x axis and a y axis, each of the circuit boards located along a z axis, each circuit board having a prefabricated conductor pattern, a plurality of unpackaged integrated circuit chips mounted to the conductor pattern of at least one circuit board, a plurality of power through-plated holes electrically connected to the conductor pattern of each circuit board, and a plurality of logic through-plated holes electrically connected to the conductor pattern of each circuit board;
   at least one power plate coplanar with and located along the z axis from said circuit boards and having a prefabricated conductor pattern for distributing electrical power, a plurality of through-plated holes electrically connected to the conductor pattern of the power plate, at least two of the through-plated holes on the power plate located substantially in respective axial alignment along the z axis with said power through-plated holes on said coplanar circuit boards;

at least one logic board coplanar with and located along the z axis from said circuit boards and having a prefabricated conductor pattern for communicating electrical signals therealong, a plurality of through-plated holes electrically connected to the conductor pattern of the logic board, at least two of the through-plated holes on the logic board located substantially in respective axial alignment along the z axis with said logic through plated holes on said coplanar circuit boards;

a plurality of electrically conductive z-axis power jumpers, each power jumper electrically connected to a through-plated hole on said power plate and an axially aligned power through-plated holes on said circuit boards;

a plurality of electrically conductive z-axis logic jumpers, each logic jumper electrically connected to a through-plated hole on said logic board and to an axially aligned logic through-plated hole on said circuit boards;

a power input means for applying electrical power to the conductor pattern of said power plate; and a spacer means for maintaining each of said circuit boards, said power plate and said logic board in a spaced, fixed, and coplanar relationship located along the z axis.

2. The apparatus according to claim 1 wherein said power input means comprises at least one power blade dimensioned to fit into an electrical power-input connector, said power blade fixedly secured to said circuit board module apparatus and in electrical contact with each said power plate prefabricated conductor pattern.

3. The apparatus according to claim 1 wherein said logic board contains at least one opening having at least one of said z-axis power jumpers passing through said opening.

4. The apparatus according to claim 1 wherein at least one of said circuit boards contains at least one opening having at least one of said z-axis logic jumpers passing through said opening.

5. The apparatus according to claim 1 wherein at last one of said z-axis logic jumpers electrically connects to a plurality of axially aligned logic through-plated holes of the circuit boards.

6. The apparatus according to claim 1 wherein at least one of said circuit board contains at least one opening having at least one of said z-axis power jumpers passing through said opening.

7. The apparatus according to claim 1 wherein at least one of said z-axis power jumpers electrically connects to a plurality of axially aligned power through-plated holes of the circuit boards.

8. The apparatus according to claim 1 wherein at least one jumper is a single elongated continuous deformable electrical conductor which connects to each axially aligned through-plated hole by mechanical deformation within the through-plated hole to establish an electrical and mechanical connection with the through-plated holes.

9. The apparatus according to claim 8 wherein all of the jumpers connect to each axially aligned through-plated hole by mechanical deformation.

10. The apparatus according to claim 9 wherein said deformed jumpers and said spacer means retain said circuit boards, said power plate and said logic board in said spaced, fixed, and coplanar relationship.

11. The apparatus according to claim 9 wherein the deformation of the jumpers is a compression of the length of the single elongated electrical connector.

12. The apparatus according to claim 9 wherein each integrated circuit chip includes a plurality of elongated leads attached thereto by which signals are applied to and received from said chip, and each chip is electrically and mechanically mounted to the conductor pattern by mechanical compression of the length of the leads within through-plated holes electrically connected to the conductor pattern of a circuit board.

13. A circuit board module apparatus having electrical connections in the x, y, and z axis directions, comprising:

an array of a plurality of circuit boards stacked in the z axis direction and coplanar in the x and y axis directions, each circuit board having a prefabricated conductor pattern, a plurality of unpackaged integrated circuit chips mounted to the conductor pattern of at least one circuit board, a plurality of power through-plated holes electrically connected to the conductor pattern of each circuit board, and a plurality of logic through-plated holes electrically connected to the conductor pattern of each circuit board;

at least one power plate coplanar with and located along the z axis direction from said circuit boards and having a prefabricated conductor pattern for electrically distributing power, a plurality of through-plated holes electrically connected to the conductor pattern of the power plate, at least two of the through-plated holes on the power plate located substantially in respective axial alignment in the z axis direction with said power through-plated holes on said coplanar circuit boards;

at least one logic board coplanar with and located along the z axis direction from said circuit boards and having a prefabricated conductor pattern for communicating electrical logic signals, a plurality of through-plated holes electrically connected to the conductor pattern of the logic board, at least two of the through-plated holes on the logic board located substantially in respective axial alignment in the z axis direction with said logic through-plated holes on said coplanar circuit boards;

a plurality of electrically conductive z-axis power jumpers, each power jumper electrically connected to a through-plated hole on said power and an axially aligned power through-plated hole on said coplanar circuit boards;

a plurality of electrically conductive z-axis logic jumpers, each logic jumper electrically connected to a through-plated hole on said logic boards and to an axially aligned logic through-plated hole on said coplanar circuit boards;

a power input means for applying electrical power to the conductor pattern of said power plate;

a spacer means for creating and maintaining a three dimensional circuit board module apparatus with said circuit board array, said power plate, and said logic board in a spaced, fixed, and superposed coplanar relationship; and said spacer means defining in conjunction with at least two of said boards or plates a fluid cooling channel for conducting non-electrically conducting liquid within said channel to remove heat from said circuit board module apparatus.

14. The apparatus according to claim 13 wherein said power input means comprises at least one power blade dimensioned to fit into an electrical power-input connector, said power blade fixedly secured to said circuit board module apparatus and in electrical contact with each said power plate prefabricated conductor pattern.

15. The apparatus according to claim 13 wherein at least one of said z-axis logic jumpers extends into the cooling channel to conduct heat from a circuit board to the fluid in the channel.

16. The apparatus according to claim 13 wherein said logic board contains at least one opening having at least one of said z-axis power jumpers passing through said opening.

17. The apparatus according to claim 13 wherein at least one of said circuit boards contains at least one opening having at least one of said z-axis logic jumpers passing through said opening.

18. The apparatus according to claim 13 wherein at least one of said z-axis logic jumpers electrically connects to a plurality of axially aligned power through-plated holes of the circuit boards.

19. The apparatus according to claim 13 wherein at least one of said circuit boards contains at least one opening having at least one of said z-axis power jumpers passing through said opening.

20. The apparatus according to claim 13 wherein at least one of said z-axis power jumpers electrically connects to a plurality of axially aligned power through-plated holes of the circuit boards.

21. The apparatus according to claim 13 wherein at least one jumper is a single elongated continuous deformable electrical conductor which connects to each axially aligned through-plated hole by mechanical deformation within each through-plated hole to establish an electrical and mechanical connection with the through-plated holes.

22. The apparatus according to claim 21 wherein all of the jumpers connect to each axially aligned through-plated hole by mechanical deformation.

23. The apparatus according to claim 22 wherein said deformed jumpers and said spacer means retain said circuit boards, said power plate and said logic board in said spaced fixed, and coplanar relationship.

24. The apparatus according to claim 22 wherein the deformation of the jumpers is a compression of the length of the single elongated electrical connector.

25. The apparatus according to claim 22 wherein each integrated circuit chip includes a plurality of elongated leads attached thereto by which signals are applied to and received from said chip, and each chip is electrically and mechanically mounted to the conductor pattern by mechanical compression of the length of the leads within through-plated holes electrically connected to the conductor pattern of a circuit board.

26. A three-dimensionally electrically interconnected circuit board module apparatus, comprising:
a plurality of at least three boards oriented generally coplanarly in a plane defined by an x axis and a y axis, each of the boards located along a z axis, each board having a prefabricated electrical conductor pattern, one of the boards being a circuit board having at least one unpackaged integrated circuit chip mounted to the conductor pattern thereof, one of the other boards being a power board for conducting electrical power to said module apparatus, and one of the other boards being a logic board;
a plurality of through-plated holes formed in each board and electrically connected to the conductor pattern of each board, at least some of the through-plated holes in two of the adjacent boards being axially aligned along the z axis;
an electrically conductive z-axis power jumper electrically connecting a through-plated hole on the power board with an axially aligned through-plated hole on the circuit board to conduct electrical power from the power board to each integrated circuit chip mounted on the conductor pattern of the circuit board; and
an electrically conductive z-axis logic jumper electrically connecting a through-plated hole on the logic board and to an axially aligned through-plated hole on the circuit board to conduct logic signals from each integrated circuit chip mounted on the conductor pattern of the circuit board.

27. The apparatus according to claim 26 wherein at least one jumper is a single elongated continuous deformable electrical conductor which connects to each axially aligned through-plated hole by mechanical deformation within the through-plated hole to establish an electrical and mechanical connection with the through-plated holes.

28. The apparatus according to claim 27 wherein all of the jumpers connect to each axially aligned through-plated hole by mechanical deformation.

29. The apparatus according to claim 28 further comprising:
spacer means for maintaining the boards in a spaced, fixed, and coplanar relationship separated along the z axis.

30. The apparatus according to claim 29 wherein said deformed jumpers and said spacer means retain said boards in said spaced, fixed, and coplanar relationship.

31. The apparatus according to claim 29 wherein at least one jumper extends into the cooling channel to conduct heat from a circuit board to the fluid in the channel.

32. The apparatus according to claim 31 wherein one of said boards contains at least one opening having at least one of the jumpers passing through said opening.

33. The apparatus according to claim 28 wherein the deformation of the jumpers is a compression of the length of the single elongated electrical connector.

34. The apparatus according to claim 28 wherein each integrated circuit chip includes a plurality of elongated leads attached thereto by which signals are applied to and received from said chip, and each chip is electrically and mechanically mounted to the conductor pattern by mechanical compression of the length of the leads within through-plated holes electrically connected to the conductor pattern of a circuit board.

35. The apparatus according to claim 26 wherein one of said boards contains at least one opening having at least one of the jumpers passing through said opening.

36. The apparatus according to claim 26 further comprising:
spacer means for maintaining the boards in a spaced, fixed, and coplanar relationship separated along the z axis, said spacer means defining in conjunction with at least two of said boards a fluid cooling channel for conducting non-electrically conducting fluid to remove heat from said circuit board.

* * * * *

UNITED STATES PATENT AND TRADEMARK OFFICE
CERTIFICATE OF CORRECTION

PATENT NO. : 5,045,975
DATED : September 3, 1991
INVENTOR(S) : Cray, et al.

It is certified that error appears in the above-identified patent and that said Letters Patent is hereby corrected as shown below:

In Claim 5, column 13, line 42 of the Patent, delete "last" and substitute therefor --least--.

Signed and Sealed this

Fifteenth Day of June, 1993

Attest:

MICHAEL K. KIRK

Attesting Officer

Acting Commissioner of Patents and Trademarks

UNITED STATES PATENT AND TRADEMARK OFFICE
CERTIFICATE OF CORRECTION

PATENT NO. : 5,045,975
DATED : September 3, 1991
INVENTOR(S) : S.R. Cray et al.

It is certified that error appears in the above-identified patent and that said Letters Patent is hereby corrected as shown below:

In Claim 11, column 14, line 3 of the Patent, delete "connector" and substitute therefor --conductor--.

In Claim 24, column 15, line 49 of the Patent, delete "connector" and substitute therefor --conductor--.

In Claim 33, column 16, line 48 of the Patent, delete "connector" and substitute therefor --conductor--.

Signed and Sealed this

Twenty-fourth Day of May, 1994

Attest:

BRUCE LEHMAN

Attesting Officer    Commissioner of Patents and Trademarks